(12) United States Patent
Lei et al.

(10) Patent No.: US 9,847,734 B1
(45) Date of Patent: Dec. 19, 2017

(54) POWER-MODULE ASSEMBLY

(71) Applicant: Ford Global Technologies, LLC, Dearborn, MI (US)

(72) Inventors: Guangyin Lei, Dearborn Heights, MI (US); Michael W. Degner, Novi, MI (US); Chingchi Chen, Ann Arbor, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/162,669

(22) Filed: May 24, 2016

(51) Int. Cl.
| | |
|---|---|
| *H02M 7/00* | (2006.01) |
| *B60K 6/26* | (2007.10) |
| *B60K 6/365* | (2007.10) |
| *B60K 6/383* | (2007.10) |
| *B60K 6/445* | (2007.10) |
| *B60K 6/40* | (2007.10) |
| *B60L 15/00* | (2006.01) |
| *H02P 27/06* | (2006.01) |
| *H05K 7/20* | (2006.01) |

(52) U.S. Cl.
CPC .............. *H02M 7/003* (2013.01); *B60K 6/26* (2013.01); *B60K 6/365* (2013.01); *B60K 6/383* (2013.01); *B60K 6/40* (2013.01); *B60K 6/445* (2013.01); *B60L 15/007* (2013.01); *H02P 27/06* (2013.01); *H05K 7/2089* (2013.01); *B60Y 2200/92* (2013.01); *B60Y 2400/61* (2013.01); *Y10S 903/906* (2013.01); *Y10S 903/91* (2013.01); *Y10S 903/913* (2013.01); *Y10S 903/93* (2013.01); *Y10S 903/951* (2013.01)

(58) Field of Classification Search
CPC ......... H02M 7/003; B60K 6/26; B60K 6/356; B60K 6/383
USPC .................. 361/689, 699; 257/712; 165/80.4
See application file for complete search history.

(56) References Cited

U.S. PATENT DOCUMENTS

| | | | |
|---|---|---|---|
| 4,714,662 A * | 12/1987 | Bennett | H01M 6/46 429/403 |
| 5,161,089 A | 11/1992 | Chu et al. | |
| 5,170,319 A | 12/1992 | Chao-Fan Chu et al. | |
| 5,841,634 A | 11/1998 | Visser | |
| 7,569,957 B2 | 8/2009 | Aoki et al. | |
| 7,835,151 B2 * | 11/2010 | Olesen | H01L 23/473 165/121 |
| 8,151,868 B2 | 4/2012 | Inagaki | |
| 9,042,100 B2 | 5/2015 | Kang | |
| 9,638,477 B1 | 5/2017 | Choi et al. | |

(Continued)

FOREIGN PATENT DOCUMENTS

| | | |
|---|---|---|
| EP | 1795852 A1 | 6/2007 |
| WO | 2015159141 A1 | 10/2015 |

*Primary Examiner* — Dion R Ferguson
*Assistant Examiner* — Mandeep S Buttar
(74) *Attorney, Agent, or Firm* — David Kelley; Brooks Kushman, P.C.

(57) ABSTRACT

A power inverter includes a plurality of power modules each having a power stage encased in a frame that defines an opening. The power modules are stacked in an array with the power stages being spaced apart to define coolant chambers interleaved with the power stages. The openings cooperate to form a manifold cavity extending along a length of the stack and in fluid communication with the chambers. A manifold insert is disposed in the cavity and extends through the openings.

20 Claims, 7 Drawing Sheets

(56) References Cited

U.S. PATENT DOCUMENTS

| | | |
|---|---|---|
| 2006/0096299 A1* | 5/2006 | Mamitsu ............... H01L 23/473 |
| | | 62/3.2 |
| 2006/0120040 A1* | 6/2006 | Chen ....................... G06F 1/20 |
| | | 361/695 |
| 2008/0186751 A1 | 8/2008 | Tokuyama et al. |
| 2008/0251909 A1 | 10/2008 | Tokuyama et al. |
| 2011/0164719 A1 | 7/2011 | Aleshin |
| 2013/0032230 A1 | 2/2013 | Olesen et al. |
| 2016/0021784 A1 | 1/2016 | Choi et al. |
| 2016/0308480 A1* | 10/2016 | Wang ................. B60L 11/1803 |
| 2016/0309622 A1* | 10/2016 | Lei .................... H05K 7/20927 |
| 2016/0309624 A1* | 10/2016 | Lei .................... H05K 7/20927 |
| 2017/0045300 A1 | 2/2017 | Boday et al. |
| 2017/0164516 A1 | 6/2017 | Scolton et al. |

* cited by examiner

POWER-MODULE ASSEMBLY

TECHNICAL FIELD

The present disclosure relates to power-module assemblies for an electric drivetrain of an automobile.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert direct current coming from the battery into alternating current compatible with the electric machines. The power inverter may also act as a rectifier to convert alternating current from the electric machines to direct current compatible with the battery.

SUMMARY

According to one embodiment, a power inverter includes a plurality of power modules each having a power stage encased in a frame that defines an opening. The power modules are stacked in an array with the power stages being spaced apart to define coolant chambers interleaved with the power stages. The openings cooperate to form a manifold cavity extending along a length of the stack and in fluid communication with the chambers. A manifold insert is disposed in the cavity and extends through the openings.

According to another embodiment, a power-module assembly includes a power-stage housing that encases power stages arranged in a stack with coolant chambers interleaved therebetween. The assembly also includes a manifold that defines a cavity and is disposed against the housing such that the chambers are in fluid communication with the cavity. A manifold insert is disposed in the cavity and includes a wall extending along a length of the cavity. The wall defines apertures arranged to permit coolant flow from the cavity and into the chambers.

According to yet another embodiment, a power-module assembly includes a power-stage assembly having power stages encased in a housing and arranged in a stack such that power stages adjacent to each other define coolant chambers interleaved with the stack. A bottom of the housing defines slots each aligned with one of the coolant chambers. The power-module assembly further includes a manifold having a bottom and sidewalls cooperating to define a manifold cavity recessed into a top of the manifold. The top is disposed against the bottom of the housing such that the manifold cavity is in fluid communication with the coolant chambers via the slots. Inlet and outlet ports are defined in at least one of the sidewalls permitting coolant to enter and exit the manifold cavity. The power-module assembly also includes a manifold insert disposed in the manifold cavity and having a horizontal wall extending along a length of the cavity and vertically aligned between a top of the inlet port and the top of the manifold. The insert defines apertures arranged to permit coolant flow from the manifold cavity and into the chambers.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
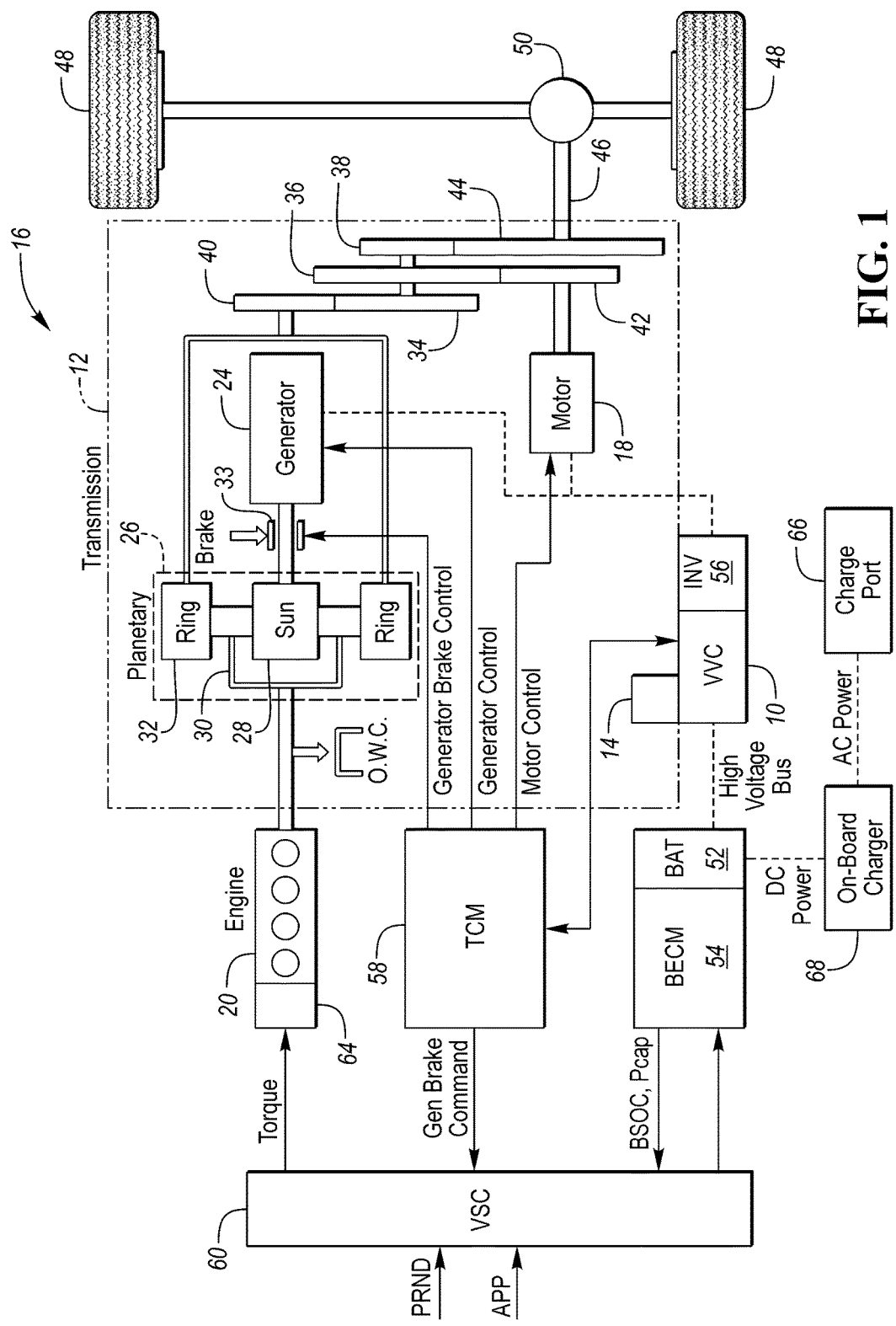
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable-voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
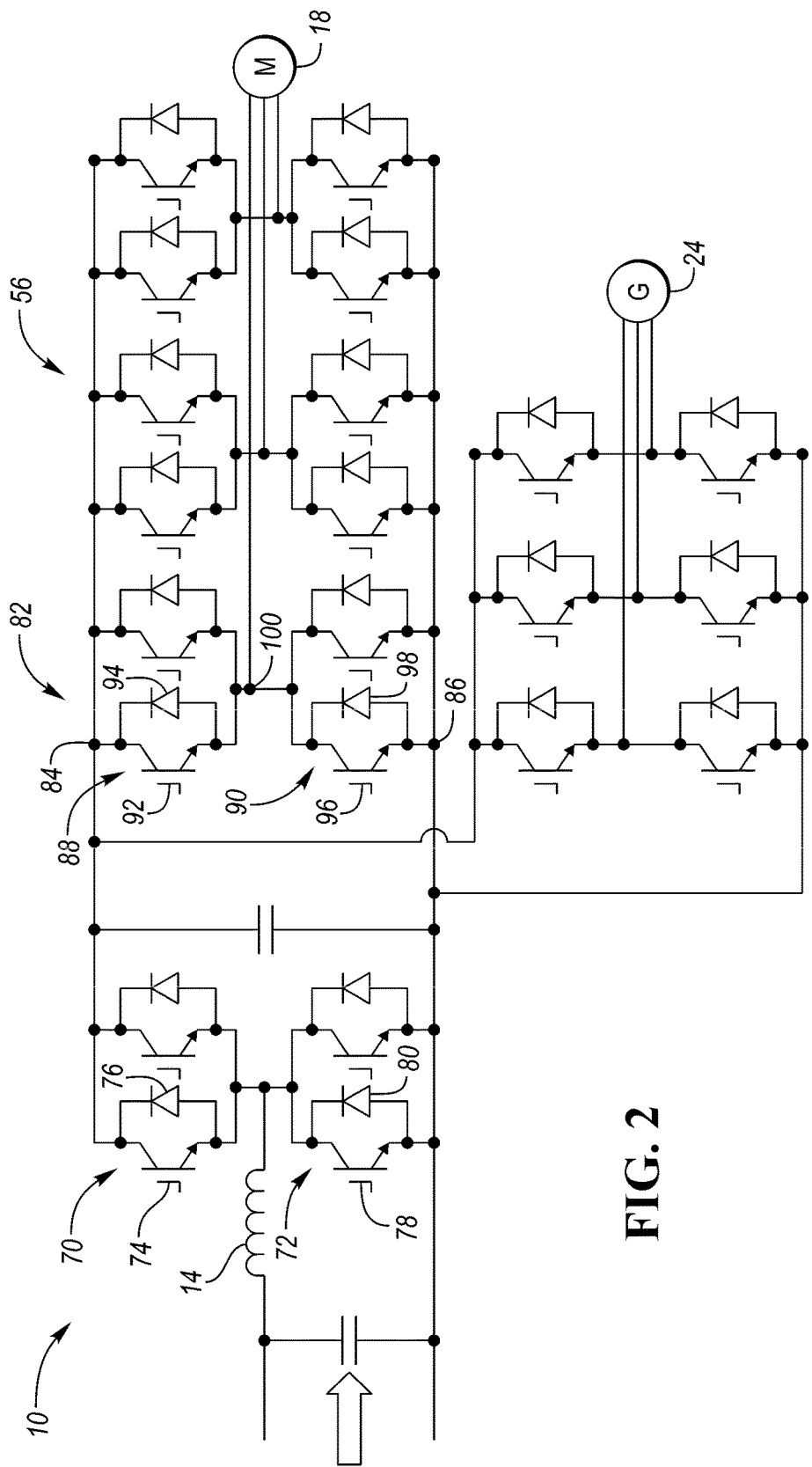
FIG. 2 is a schematic diagram of a variable-voltage converter and a power inverter.

Referring to FIG. 2, an electrical schematic of the VVC 10 and the inverter 56 is shown. The VVC 10 may include a one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as a half-bridge that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected anti-parallel to a first diode 94. The second switching unit 90 may include a second transistor 96 connected anti-parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages 82. Both the VVC power stages and the inverter power stages may be arranged in a common stack.

Figure 3:
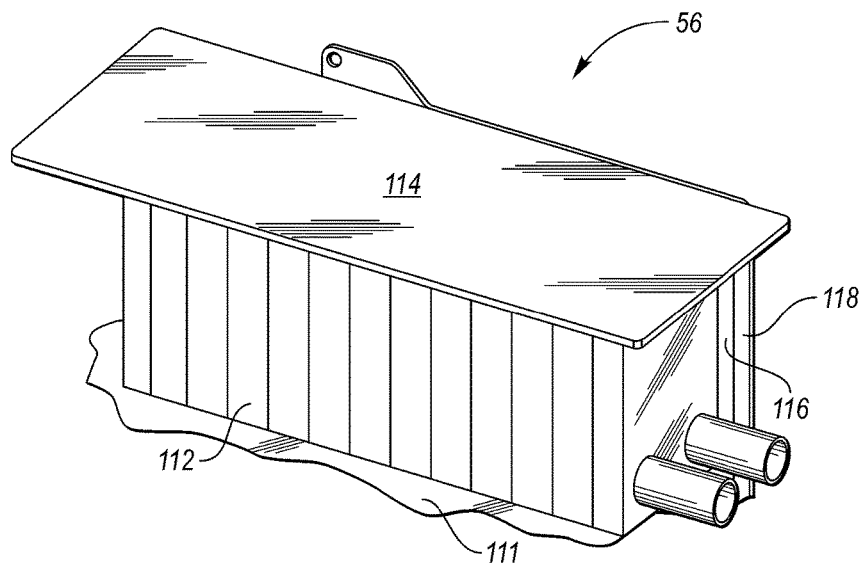
FIG. 3 is a perspective view of a power inverter.

Referring to FIG. 3, the vehicle power inverter 56 may be mounted on a vehicle component 111, such as a body structure, frame member, or powertrain component. The power inverter 56 may include a power-module assembly 112 that is electrically connected with a gate drive board 114, a capacitor bank 116, and a control board 118. The power-module assembly 112 may include a plurality of power modules stacked in an array and each having one or more half bridges packaged in a power stage.

Figure 4:
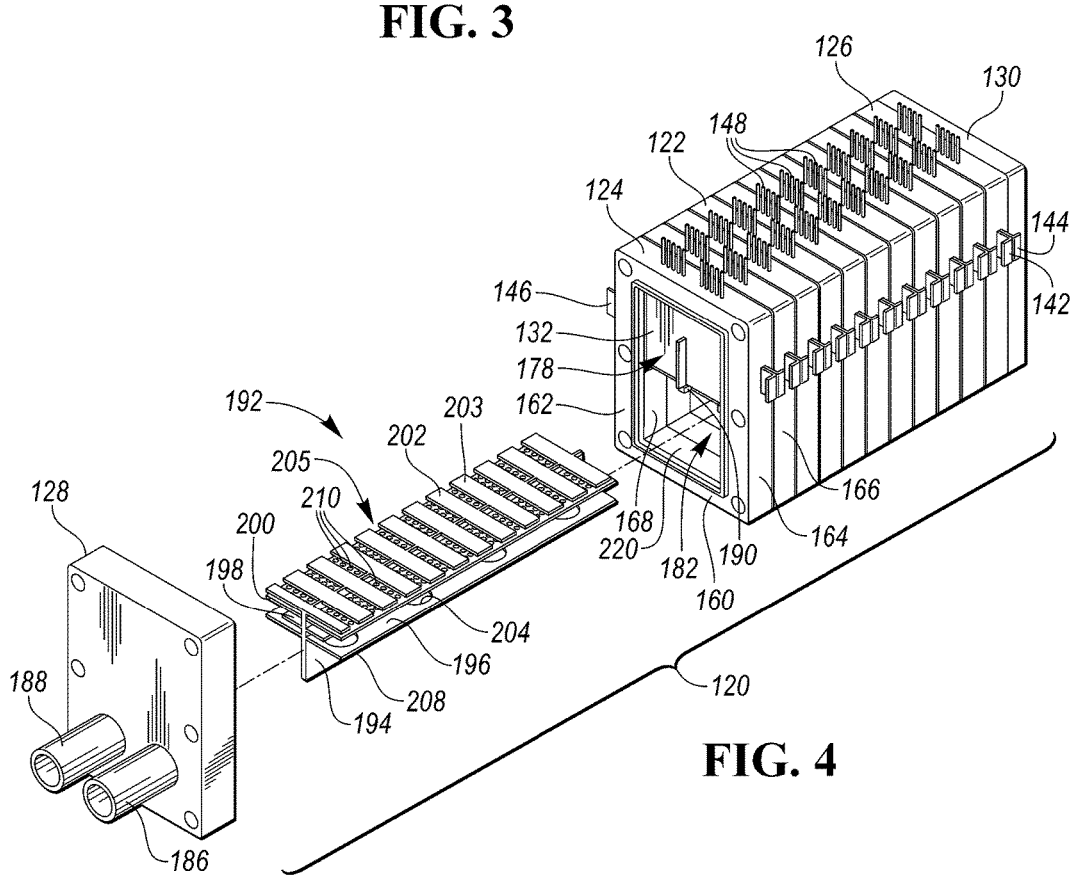
FIG. 4 is an exploded perspective view of a power-module assembly.

FIGS. 4 to 12 and the related discussion describe example power-module assemblies and their individual components. The power-module assemblies may be of a power inverter such as power inverter 56 described above or may be another type of power electronics. Referring to FIG. 4, an example power-module assembly 120 includes a plurality of power modules 122 stacked an array. Each power module includes opposing major sides 162 and minor sides 164 extending therebetween. The power modules 122 are stacked such that the major sides 162 of adjacent power modules are disposed against each other. The power-module assembly 120 includes a first power module 124 defining one end of the stack and a last power module 126 defining the other end of the stack. A first endplate 128 is disposed against the first module 124, and a second endplate 130 is disposed against the last module 126. The endplates cooperate to sandwich the stack and may provide compression to help hold the stack together. The power-module assembly 120 may be secured together by adhesive, bracketry, or fasteners extending through the assembly. The power modules 122 may all be a same power module, or the power-modules assembly 120 may include two or more sets of power modules that are at least slightly different. In the example power-module assembly 120, all of the power modules 122 are the same.

Each of the power modules 122 includes a power stage 132 that contains the semiconductor devices. Each power stage 132 may include a half bridge. The power stages 132 are encased by a frame 160 of the power module 122. In the illustrated embodiment, the frame 160 is a hollow rectangular body including a left side 154, a right side 152, a top 150, and a bottom 151 cooperating to define an exterior 166, an interior 168, a front surface 170, and a back surface 172. The frame 160 may have a different shape in other embodiments.

Each of the power stages 132 may include opposing major sides 134, opposing minor sides 136, a top 138, and a bottom 140. The edges of the power stage 132 are embedded in the interior surface 168. The power stage 132 may include a positive DC power terminal 142, a negative DC power terminal 144, an AC power terminal 146, and signal pins 148 that are electrically connected with the semiconductor devices of the power stage 132. The location of the terminals and signal pins may vary by embodiment and are not limited to the configuration shown. In this example, the signal pins 148 may extend from the top 150, terminals 142 and 144 may extend from the right side 152, and the terminal 146 may extend from the left side 154. Each of the power stages 132 may include a first plate 156 that defines the outer surface of one of the major sides 134 and a second plate (not visible) that defines the other of the major sides 134. The plates may be metallic, plastic, composite, or a combination thereof. The semiconductor devices of the power stage 132 may be filled with an epoxy or other material to electrically isolate the semiconductor devices from the plates and other components.

Each of the frames 160 also defines a manifold opening 174 adjacent to the power stage 132. The opening 174 may be defined by the cooperation of the interior 168 of the left side 154, the right side 152, and the bottom 151. The top of the opening 174 may be defined by a cross member 176. In embodiments where the cross member 176 is not present, the bottom 140 of the power stage 132 defines the top of the opening 174.

The frame 160 is thick enough to extend past the outer plates 156 of the power stage 132 in the longitudinal direction of the stack. The extended region of the frame 160 and the plates 156 define a pair of pockets 178 recessed into the major sides 162 of the power module 122.

Figure 5:
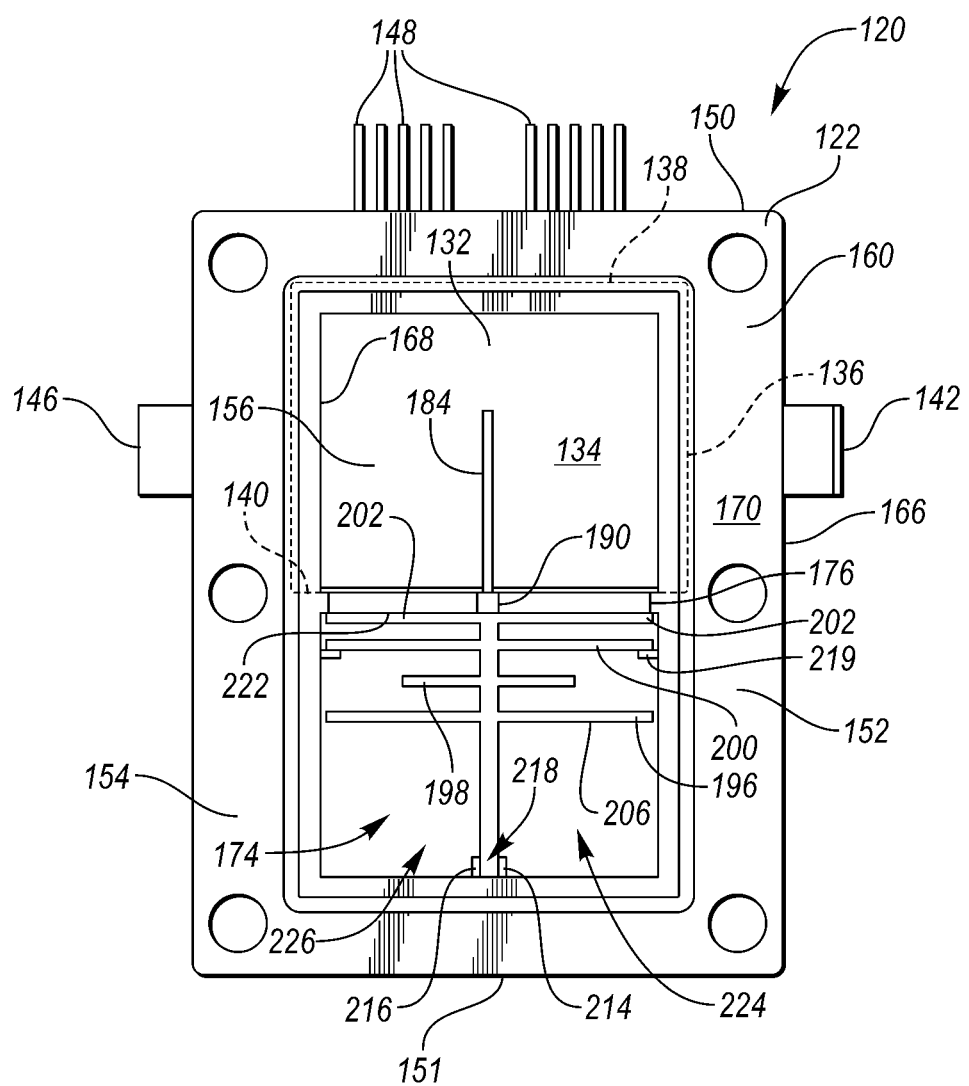
FIG. 5 is a front view of the power-module assembly of FIG. 4 with the front endplate removed for illustrative purposes.
Figure 6:
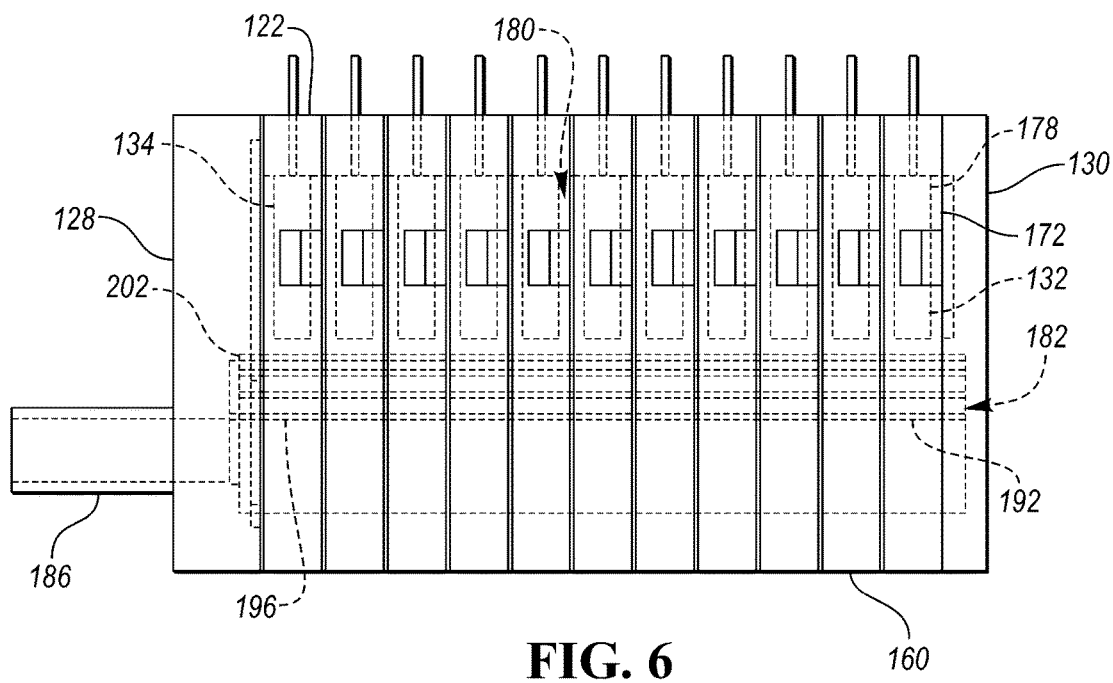
FIG. 6 is a side view of the power-module assembly of FIG. 4.

As is best shown in FIGS. 5 and 6, the individual power modules 122 are arranged in a stack with the front and back surfaces 170, 172 of adjacent frames 160 being disposed against each other. When stacked, the pockets 178 of adjacent power modules 122 cooperate to define coolant chambers 180 interleaved with the modules 122. The endplates may also define pockets that cooperate with the pockets of the power modules to define some of the coolant chambers 180. For example, the first endplate 128 cooperates with the first module 124 to define an outer coolant chamber, and the second endplate 130 cooperates with last module 126 to define another outer coolant chamber. The outer coolant chambers may have a smaller volume than the interior coolant chambers, or the endplates may have a recessed area to provide outer coolant chambers having a same or similar volume as the interior coolant chambers. Alternatively, the outer coolant chambers may be omitted. For example, each of the endplates 128, 130 may include a protruding face that is received within the outer pocket of the first and last modules 124, 126 to fill the pocket. Each of the coolant chambers 180 may be bounded on all sides by features of the frame 160 and power stage 132 or may only be bounded on five sides and may have an open bottom side. Each of the coolant chambers 180 may include a vertical partitioning wall 184 that extends upwardly from the cross member 176 to partially divide the coolant chamber 180 creating a U-shaped flow path. The partitioning wall 184, the cross member 176 may be integrally formed with the frame. The partitioning wall 184 and the cross member 176 are not included in all embodiments. Each of the coolant chambers 180 may include fins (not shown) or other features disposed therein to guide fluid circulating within the chamber.

The openings 174 of each power module cooperate to define a manifold cavity 182 extending along a length of the stack. The ends of the manifold cavity 182 are bounded by the endplates and the longitudinal sides are bounded by the plurality of power modules 122. The manifold cavity 182 is in fluid communication with each of the coolant chambers 180. For example, the cross members 176 may define openings 190 allowing fluid to flow from the manifold cavity 182 and into the chambers 180. The first endplate 128 includes an inlet port 186 and an outlet port 188 that each open into the manifold cavity 182. In other embodiments, the inlet port may be located in different endplate than the outlet port.

The coolant chambers 180 may be connected to the manifold such the chambers are arranged in parallel flow paths. The parallel flow provides a more uniform temperature gradient along the length of the stack because the coolant within the supply chamber of the manifold is relatively uniform. Coolant chambers arranged in series may have a relatively large temperature gradient, where coolant at the exit end of the stack is much hotter than at the entrance end of the stack. In some embodiments, series cooling may be advantageous. As such, series cooling is not outside the scope of this disclosure.

Referring back to FIGS. 4 and 5, a manifold insert 192 is disposed within the manifold cavity 182 to more precisely control the flow of coolant to the coolant chambers 180. The manifold insert may take on a variety of different shapes and feature depending upon the precise flow characteristics needed to effectively cool (or heat) the power-module assembly 120. The specific features of illustrated insert 192 are not to be construed as limiting and several other design alternatives will be presented below. These alternatives, however, are also not limiting. The manifold insert 192 may extend along a length of the manifold cavity 182 with a first end of the manifold insert 192 abutting the first endplate 128 and a second end of the insert abutting the second endplate 130. The insert 192 may include a vertical wall 194 extending between a bottom 220 of the manifold cavity 182 and a top 222 of the cavity to divide the cavity 182 into a supply side 224 and a return side 226. The insert 192 also includes a lower horizontal wall 196 that is oriented substantially perpendicular to the vertical wall 194. Used herein, "substantially perpendicular" means the angle between the substantially perpendicular components is between 80 and 100 degrees, inclusive. The wall 196 includes a pair of opposing planar surface 206 oriented to face the top and bottom of the cavity, respectively, and edges 208 that are disposed against the interior 168 of the left and right frame walls, respectively. Apertures 204 are defined in the wall 196 to permit fluid to flow therethrough. The lower wall 196 may be positioned such that it is above a top of the inlet and outlet ports 186, 188.

Insert 192 may also include an upper horizontal wall 200 that also includes planar surfaces (oriented similar to surfaces 206) and edges that engage with the interior 168. The upper horizontal wall 200 may define a plurality of apertures 210. The apertures 210 may be much smaller than the apertures 204, and may be greater in number. The insert 192 may also include an intermediate horizontal wall 198. The intermediate wall 198 may only extend partially across the cavity. The intermediate wall 198 may be useful in creating turbulence to increase the cooling effectiveness of the system. The edges of the intermediate wall 198 may not extend as far from the vertical wall 194 as the other walls 196, 200. An array of flaps 202 may be disposed across the upper edge of the vertical wall 194. The flaps 202 are spaced apart to create a plurality of slots 205 to allow fluid to flow between the flaps 202. An upper planar surface 203 of the flaps 202 engages with the cross members 176. The flaps 202 are arranged such that the slots 205 are aligned with the openings 190 to permit fluid to flow into the coolant chambers 180.

At least some of the frames 160 may include at least one connection feature 214 to secure the insert 192 within the manifold cavity 182. The connection feature 214 may be integrally formed with the frames and extend from select interior surfaces 168. In the illustrated embodiment, three connection features are shown. A first connection feature 214 is disposed on the bottom 151 and includes a pair of projections 216 defining a slot 218 that receives an edge portion of the vertical wall 194. A second connection feature and a third connection feature may be disposed on the right and left walls 152, 154 respectively. Each of these features includes a single projection 219 that cooperates with the cross member 176 to define a slot. The projections 219 may engage with the upper horizontal wall 200, and the cross members 176 may each engage with a corresponding flap 202. An adhesive or similar material may be used to permanently bond the connection features and the insert.

Figure 7:
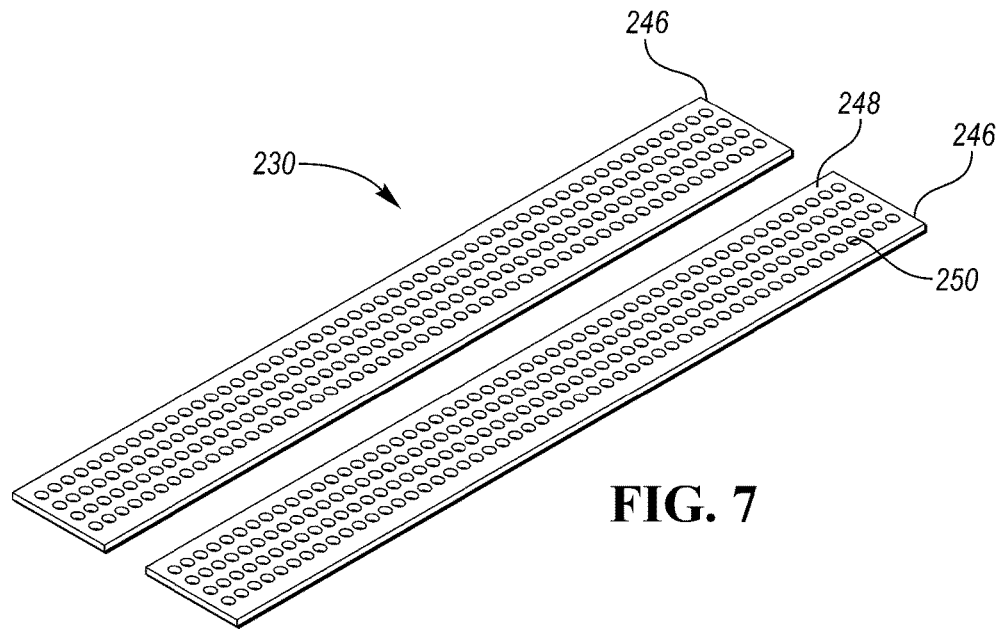
FIG. 7 is a perspective view of a manifold insert according to another embodiment.
Figure 8:
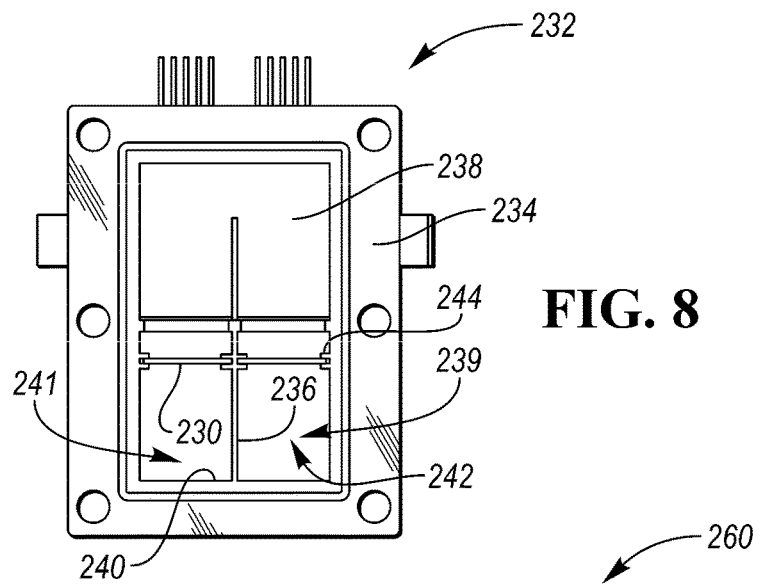
FIG. 8 is a front view of another power-module assembly having the insert of FIG. 7; the front endplate is removed for illustrative purposes.

Referring to FIGS. 7 and 8, an insert 230 according to another embodiment is illustrated within a power-module assembly 232 that is similar to the power-module assembly 120. The frame 234 of this assembly is similar to that of frame 160 except that frame 234 includes a partitioning wall 236 that extends between the bottom of the power stage 238 and the bottom 240 of the manifold cavity 242 dividing the cavity into supply and return sides 239, 241. The partitioning wall 236 may be integrally formed with the frame 234. The frame 234 may include connection features 244 that secure the insert 230 within the manifold cavity 242. In this embodiment, the insert 230 is a pair of planar inserts 246 that are each inserted into one of the sides of the manifold cavity 242. Each insert 246 may include opposing planar surfaces 248 and apertures 250 extending between the planar surfaces. The inserts are arranged in the cavity such that one of the planar surfaces faces the power stages, and such that the inserts are disposed between a top of the inlet and outlet ports and a bottom of the power stages.

Figure 9:
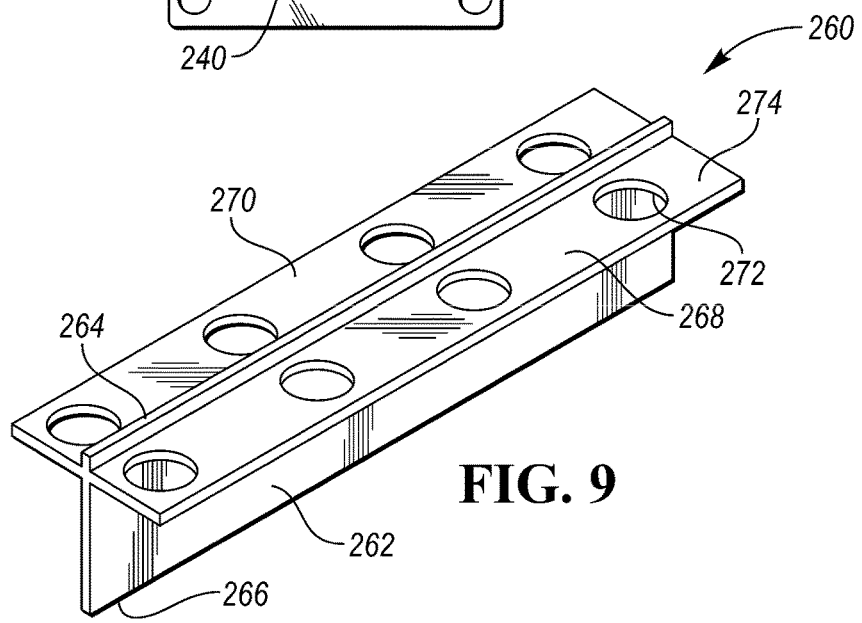
FIG. 9 is a perspective view of a manifold insert according to yet another embodiment.
Figure 10:
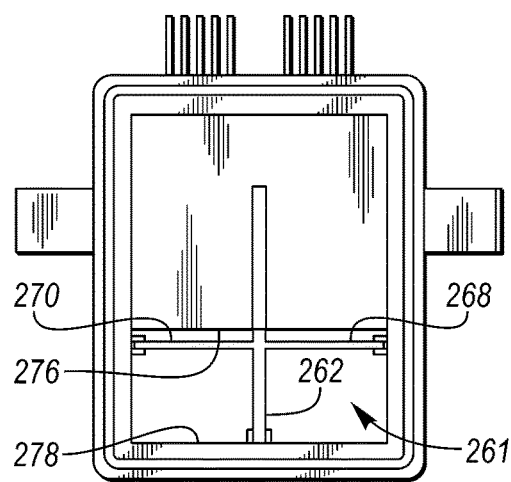
FIG. 10 is a front view of yet another power-module assembly having the insert of FIG. 9; the front endplate is removed for illustrative purposes.

Referring to FIGS. 9 and 10, another insert 260—that may be inserted into manifold cavity 261, for example—includes a vertical wall 262 having an upper edge 264 and a lower edge 266. The upper edge 264 engages with a top 276 of the manifold cavity 261, and the lower edge 266 engages with a bottom 278 of the manifold cavity. A first horizontal wall 268 extends from the right side of the vertical wall 262, and a second horizontal wall 270 extends from the left side. Each of the horizontal walls 268, 270 define apertures 272 that allow coolant to circulate between the coolant chambers and the manifold cavity. The horizontal walls 268, 270 may be positioned such that at least a portion of the vertical wall 262 extends above an upper planar surface 274 of the horizontal walls.

Figure 11:
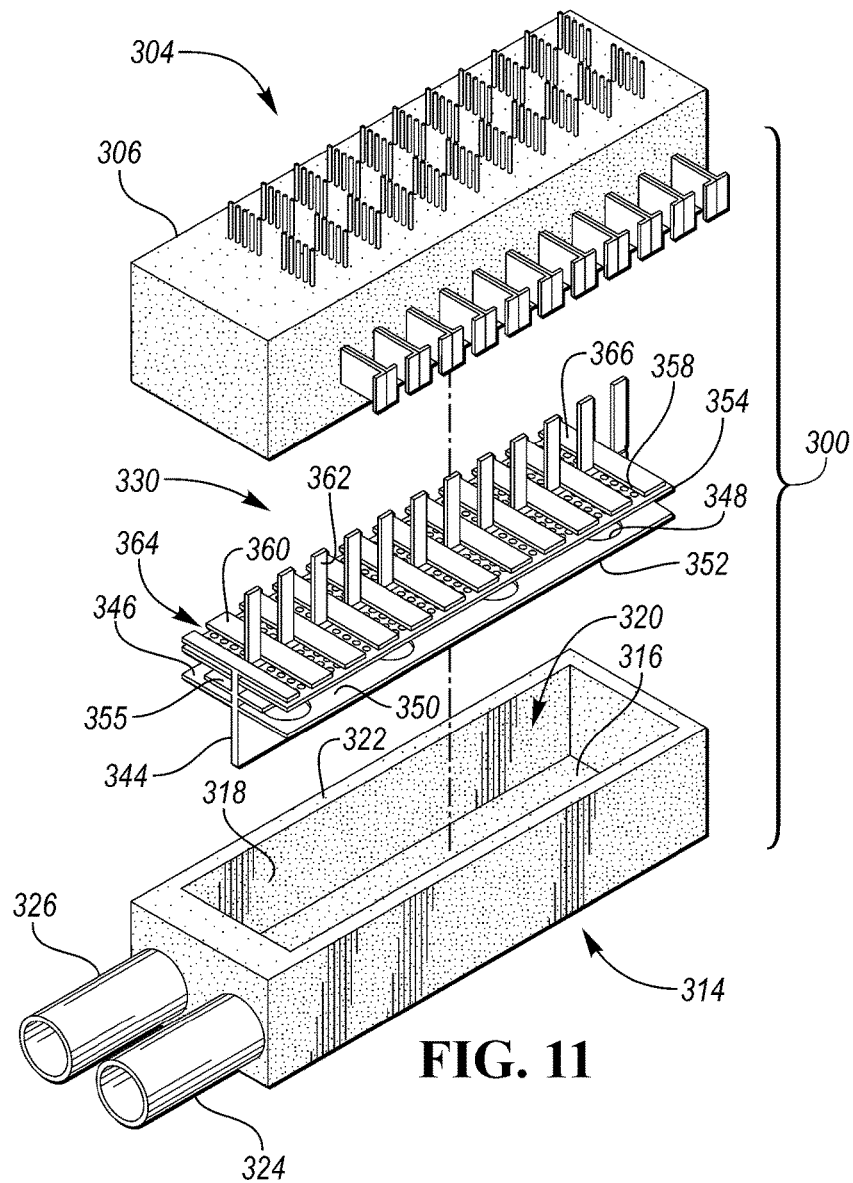
FIG. 11 is an exploded perspective view of a power-module assembly according to an over-molded embodiment.
Figure 12:
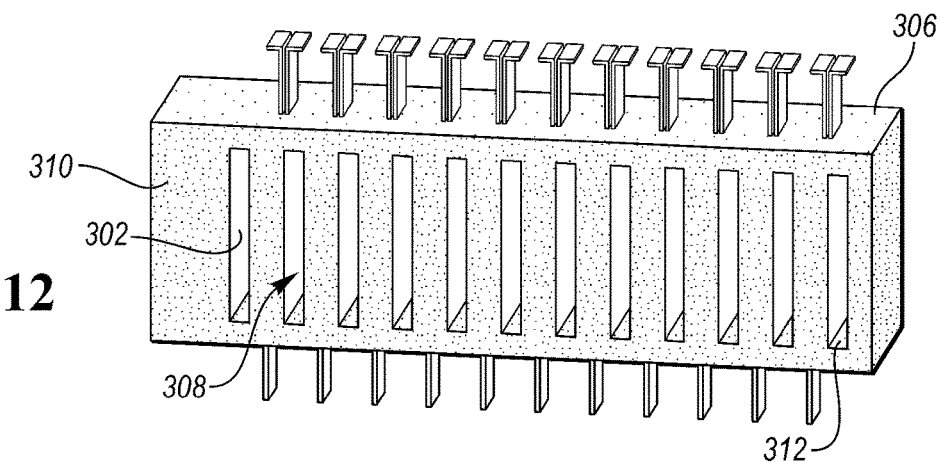
FIG. 12 is a bottom perspective view of the power-stage assembly for the power-module assembly shown in FIG. 11.

Referring to FIGS. 11 and 12, another power-module assembly 300 is illustrated. Unlike assembly 120, which includes a plurality of modular power modules 122 assembled into a stack, assembly 300 includes a plurality of power stages 302 that that are molded into a housing 306 to form a power-stage assembly 304, which may be a single piece. The power stages 302 are arranged in a spaced apart relationship relative to each other creating coolant chambers 308 that are interleaved with the power stages. The housing 306 includes a bottom 310 that defines slots 312 in alignment with the coolant chambers 308. The slots 312 allow coolant to circulate into and out of the chambers 308.

The assembly 300 also includes a manifold 314 that includes a bottom 316 and a plurality of sidewalls 318 extending from the bottom to define a manifold cavity 320. The manifold 314 also includes an inlet port 324 and an outlet port 326 that open into the manifold. The ports may be located in a same sidewall or may be located in different sidewalls.

An insert 330 is disposed within the manifold cavity 320 to control the coolant flow. The manifold insert may take on a variety of different shapes such as those shown in FIG. 11 or any of the preceding figures. The specific features of illustrated insert 330 are not to be construed as limiting.

The manifold insert 330 may extend along a length of the manifold cavity 320 with a first end of the manifold insert abutting the front wall and a second end of the insert abutting the back wall. The insert 330 may include a vertical wall 344 extending between a bottom 316 of the manifold cavity 320 and a top 322 of the cavity to divide the cavity 320 into a supply side and a return side. The insert 330 also includes a lower horizontal wall 346 that is oriented substantially perpendicular to the vertical wall 344. The wall 346 includes a pair of opposing planar surface 350 oriented to face the top and bottom of the cavity, respectively, and edges 352 that are disposed against the sidewalls 318. The apertures 348 are defined in the wall 346 to permit fluid to flow therethrough. The lower wall 346 may be positioned such that it is above a top of the inlet and outlet ports 324, 326.

Insert 330 may also include an upper horizontal wall 354 that also includes planar surfaces (oriented similar to surfaces 350) and edges that engage with the sidewalls 318. The upper horizontal wall 354 may define a plurality of apertures 358. The apertures 358 may be much smaller than the apertures 348, and may be greater in number. The insert 330 may also include an intermediate horizontal wall 355. The intermediate wall 355 may only extend partially across the cavity. The intermediate wall 355 may be useful in creating turbulence to increase the cooling effectiveness of the system. The edges of the intermediate wall 355 may not extend to the sidewalls 318. An array of flaps 360 may be disposed across the upper edge of the vertical wall 344. The flaps 360 are spaced apart to create a plurality of slots 364 allowing fluid to flow between the flaps 360. An upper planar surface 366 of the flaps 360 engages with the bottom 310. The flaps 360 are arranged such that the slots 364 are aligned with the slots 312 to permit fluid to flow into the coolant chambers 308. The insert 330 may also include a plurality of flow guides 362 extending upwardly from the top of the vertical wall 344. The flow guides 362 are spaced apart from each other corresponding to the spacing of the coolant chambers 308. The flow guides 362 may extend upwardly between the flaps 360. The flow guides 362 are disposed in the coolant chambers 308 to partition the coolant chambers 308 into an inlet side and an outlet side. In some embodiments the flow guides are omitted and the housing 306 may define the partitioning walls in order to divide the coolant chambers. While not illustrated, the manifold 314 may include one or more connection features (such as those previously described) to secure the insert 330 within the cavity 320. The insert 330 may also be secured within the cavity using adhesive or other bonding means.

The assembly 300 may be assembled by first manufacturing the power stage assembly 304, the manifold 314, and the insert 330. Next, the insert 330 may be disposed within the manifold cavity 320. Then, the top 322 of the manifold 314 is disposed against the bottom 310 of the housing 306 with the flow guides 362 extending into the coolant chambers 308.

The illustrated embodiments show the manifold-insert apertures as being round. But, it is to be understood that the aperture could have any shape suitable to permit coolant flow therethrough. The specific sizes of the aperture illustrated are not limiting and the size of the apertures may vary in different embodiments.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A power inverter comprising:
power modules each including a power stage encased in a frame defining an opening, the modules being stacked in an array with the power stages spaced to define coolant chambers interleaved with the power stages, and the openings cooperating to form a manifold cavity extending along a length of the stack and in fluid communication with the chambers; and a manifold insert disposed in the cavity and extending through the openings.

2. The power inverter of claim 1, wherein the manifold insert defines a plurality of apertures permitting fluid to flow from the manifold cavity and into the coolant chambers.

3. The power inverter of claim 1, wherein at least one of the frames defines a connection feature that engages the manifold insert to secure the insert in the manifold cavity.

4. The power inverter of claim 3, wherein the connection feature defines a slot that receives a portion of the insert therein.

5. The power inverter of claim 1 further comprising an endplate disposed against one end of the stack and defining an inlet port opening into the manifold cavity, wherein a planar wall of the insert is disposed between the inlet port and the coolant chambers.

6. The power inverter of claim 1, wherein each of the frames further includes a partitioning wall extending between opposing walls of the opening to divide the opening into a pair of openings, wherein the partitioning walls cooperate to form a supply cavity and a return cavity.

7. The power inverter of claim 1, wherein the manifold insert further includes a first planar surface facing the coolant chambers and a second planar surface that is substantially perpendicular to the first surface.

8. A power-module assembly comprising:
a power-stage housing encasing power stages arranged in a stack with coolant chambers interleaved therebetween;
a manifold defining a cavity and disposed against the housing such that the chambers are in fluid communication with the cavity; and
a manifold insert disposed in the cavity and including a wall extending along a length of the cavity and defining apertures arranged to permit coolant flow from the cavity and into the chambers.

9. The power-module assembly of claim 8, wherein the housing defines slots in a side facing the manifold, and wherein each of the slots opens into one of the coolant chambers.

10. The power-module assembly of claim 8, wherein the wall includes a planar surface that faces the coolant chambers and the apertures are defined in the planar surface.

11. The power-module assembly of claim 8, wherein a wall of the cavity defines a connection feature that engages the manifold insert to secure the insert in the cavity.

12. The power-module assembly of claim 11, wherein the connection feature defines a slot that receives a portion of the insert therein.

13. The power-module assembly of claim 8, wherein the insert includes a plurality of flow guides that each extend into one of the coolant chambers.

14. The power-module assembly of claim 13, wherein the wall and the flow guides are substantially perpendicular to each other.

15. The power-module assembly of claim 8, wherein the housing defines partitioning walls each disposed in a corresponding one of the coolant chambers, wherein each of the partitioning walls extends between power stages adjacent to each other to divide the coolant chambers into an inlet portion and an outlet portion.

16. The power-module assembly of claim 8, wherein each of the power stages includes a half-bridge switching arrangement.

17. A power-module assembly comprising:
a power-stage assembly including power stages encased in a housing and arranged in a stack such that power stages adjacent to each other define coolant chambers interleaved with the stack, wherein a bottom of the housing defines slots each aligned with one of the coolant chambers;
a manifold including a bottom and sidewalls cooperating to define a manifold cavity recessed into a top of the manifold, wherein the top is disposed against the bottom of the housing such that the manifold cavity is in fluid communication with the coolant chambers via the slots, and inlet and outlet ports are defined in at least one of the sidewalls permitting coolant to enter and exit the manifold cavity; and
a manifold insert disposed in the manifold cavity and including a horizontal wall extending along a length of the cavity and vertically aligned between a top of the inlet port and the top of the manifold, wherein the insert defines apertures arranged to permit coolant flow from the manifold cavity and into the chambers.

18. The power-module assembly of claim 17, wherein the manifold insert includes a vertical wall extending along the length of the manifold cavity between the inlet and outlet ports to divide the manifold cavity into a supply cavity and a return cavity.

19. The power-module assembly of claim 17, wherein at least one of the bottom and sidewalls defines a connection feature that engages the manifold insert to secure the insert in the cavity.

20. The power-module assembly of claim 19, wherein the connection feature defines a slot that receives a portion of the insert therein.

* * * * *